United States Patent
Scheiper et al.

(10) Patent No.: US 9,082,662 B2
(45) Date of Patent: Jul. 14, 2015

(54) SOI SEMICONDUCTOR DEVICE COMPRISING A SUBSTRATE DIODE AND A FILM DIODE FORMED BY USING A COMMON WELL IMPLANTATION MASK

(71) Applicant: GLOBALFOUNDRIES Inc., Grand Cayman (KY)

(72) Inventors: Thilo Scheiper, Dresden (DE); Stefan Flachowsky, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 173 days.

(21) Appl. No.: 13/968,545

(22) Filed: Aug. 16, 2013

(65) Prior Publication Data

US 2013/0334604 A1  Dec. 19, 2013

Related U.S. Application Data

(62) Division of application No. 13/233,762, filed on Sep. 15, 2011, now Pat. No. 8,536,033.

(30) Foreign Application Priority Data

Jan. 19, 2011  (DE) .......................... 10 2011 002 877

(51) Int. Cl.
    *H01L 27/12*  (2006.01)
(52) U.S. Cl.
    CPC ........ *H01L 27/1203* (2013.01); *H01L 27/1207* (2013.01)

(58) Field of Classification Search
    CPC .............. H01L 27/0727; H01L 21/266; H01L 27/0629
    USPC .......................................................... 257/350
    See application file for complete search history.

(56) References Cited

U.S. PATENT DOCUMENTS

| | | | |
|---|---|---|---|
| 7,741,164 B2 * | 6/2010 | Pelella .......................... | 438/155 |
| 8,097,519 B2 * | 1/2012 | Wiatr et al. .................... | 438/311 |
| 8,617,940 B2 * | 12/2013 | Kurz et al. .................... | 438/151 |
| 2008/0268585 A1 | 10/2008 | Gehring et al. | |
| 2010/0187586 A1 | 7/2010 | Pellela et al. | |
| 2011/0186929 A1 * | 8/2011 | Heinrich et al. .............. | 257/350 |

FOREIGN PATENT DOCUMENTS

EP      0 948 054 A2    10/1999

OTHER PUBLICATIONS

Translation of Official Communication for German Patent Application No. 10 2011 002 877.3 dated Sep. 29, 2011.

* cited by examiner

*Primary Examiner* — Yu-Hsi D Sun
(74) *Attorney, Agent, or Firm* — Amerson Law Firm, PLLC

(57) ABSTRACT

When forming sophisticated SOI devices, a substrate diode and a film diode are formed by using one and the same implantation mask for determining the well dopant concentration in the corresponding well regions. Consequently, during the further processing, the well dopant concentration of any transistor elements may be achieved independently from the well regions of the diode in the semiconductor layer.

7 Claims, 3 Drawing Sheets

SOI SEMICONDUCTOR DEVICE COMPRISING A SUBSTRATE DIODE AND A FILM DIODE FORMED BY USING A COMMON WELL IMPLANTATION MASK

CROSS-REFERENCE TO RELATED APPLICATION

This is a divisional of co-pending application Ser. No. 13/233,762, filed Sep. 15, 2011, which claimed priority from German Patent Application No. 10 2011 002 877.3, filed Jan. 19, 2011.

BACKGROUND OF THE INVENTION

1. Field of the Invention

Generally, the present disclosure relates to integrated circuits and, more particularly, to silicon-on-insulator (SOI) semiconductor devices, which include substrate diodes that are formed in the crystalline material of the substrate and which include film diodes that are formed in the active semiconductor layer.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed above a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. These regions are embedded or are formed in a well region, which has an appropriate doping level and profile so as to adjust the basic transistor characteristics, such as threshold voltage and the like. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the distance between the source and drain regions, which is also referred to as channel length. Therefore, reducing the feature sizes and in particular the gate length of the field effect transistors has been an important design criterion.

In view of further enhancing performance of transistors, in addition to other advantages, the SOI architecture has continuously been gaining in importance for manufacturing MOS transistors due to their characteristics of a reduced parasitic capacitance of the PN junctions, thereby allowing higher switching speeds compared to bulk transistors. In SOI transistors, the semiconductor region or active region, in which the drain and source regions as well as the channel region are located, also referred to as the body, is dielectrically encapsulated. This configuration provides significant advantages, but also gives rise to a plurality of issues. Contrary to the body of bulk devices, which is electrically connected to the substrate and thus applying a specified potential to the substrate maintains the bodies of bulk transistors at a specified potential, the body or well of SOI transistors is not connected to a specified reference potential, and, hence, the body's potential may usually float due to the accumulation of minority charge carriers, unless appropriate countermeasures are taken.

A further issue in high performance devices, such as microprocessors and the like, is an efficient device-internal temperature management due to the significant heat generation of the transistors. Due to the reduced heat dissipation capability of SOI devices caused by the buried insulating layer, the corresponding sensing of the momentary temperature in SOI devices is of particular importance.

Typically, for thermal sensing applications, an appropriate diode structure may be used, wherein the characteristic of the diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may depend on temperature and other parameters. For thermal sensing applications, it may, therefore, typically be desirable to provide a substantially ideal diode characteristic in order to allow a precise estimation of the temperature conditions within the semiconductor device. In SOI devices, a corresponding diode structure, i.e., the respective PN junction, is frequently formed in the substrate material located below the buried insulating layer, above which is formed the active semiconductor layer used for forming therein the transistor elements. Thus, at least some additional process steps may be required, for instance, for etching through the semiconductor layer or a corresponding trench isolation area and through the buried insulating layer in order to expose the crystalline substrate material. On the other hand, the process flow for forming the substrate diode is typically designed so as to exhibit a high degree of compatibility with the process sequence for forming the actual circuit elements, such as the transistor structures.

During the development of very sophisticated semiconductor devices on the basis of an SOI architecture, however, diode structures formed in the crystalline substrate material may provide valuable information, for instance with respect to the thermal state of the substrate material, wherein, however, an accurate assessment of the general thermal conditions in the device level, i.e., in the semiconductor layer formed above the buried insulating material, may be difficult since the heat dissipation through the buried insulating material, which may have a significantly lower thermal conductivity compared to a silicon material, may result in a pronounced temperature gradient between the active semiconductor layer and the substrate material. To this end, frequently, additional diode structures may also be used for other purposes, such as providing appropriate discharge paths for electrostatic discharge events (ESD) and the like. The substrate diodes formed in the active semiconductor layer, which may also be referred to as a "film diode," may also require specifically selected diode characteristics in order to obtain the desired function, for instance, for obtaining representative information on the thermal conditions within the active semiconductor layer. Generally, the PN junction for the diode structures may be formed on the basis of an appropriate well dopant concentration in combination with a corresponding inversely doped region, which is typically formed together with drain and source regions of transistors to be formed in the active semiconductor layer in order to reduce the number of required lithography steps. Since the well dopant implantation processes for the diode structures in the active semiconductor layer and in the buried crystalline substrate material have to be performed on the basis of very different implantation parameters, in conventional process strategies, therefore, the well dopant concentration of the diode structure in the active semiconductor layer may be established in a common process sequence for incorporating the well dopant species of certain types of transistors in order to not unduly increase the number of lithography steps. A typical conventional process flow will be described in more detail with reference to FIGS. 1a-1c.

FIG. 1a schematically illustrates a cross-sectional view of a semiconductor device 100 in a manufacturing phase in which the basic well dopant concentration profiles are to be established for any diode structures and transistor elements of the device 100. As shown, the device 100 is an SOI device comprising a substrate 101, which may thus comprise a crystalline semiconductor material 101S, for instance in the form of a silicon material. Moreover, a buried insulating layer 102, such as a silicon dioxide layer, is formed on the crystalline substrate material 101S with an appropriate thickness. Furthermore, a semiconductor layer 103, which may also be referred to as an active semiconductor layer, is formed on the buried insulating layer 102. It should be appreciated that the term semiconductor layer is to enclose an initial state of the layer 103, in which a substantially continuous semiconductor material is formed above the buried insulating layer 102, and is also to enclose the semiconductor layer 103 in a further process state in which a plurality of semiconductor islands or regions may be formed by providing appropriately sized isolation regions (not shown), which may thus appropriately laterally delineate corresponding semiconductor regions. For example, corresponding portions of the semiconductor layer 103, as indicated by 103A, 103B, 103C, may be provided in the manufacturing stage shown, wherein at least the regions 103B, 103C may represent actual semiconductor regions, while the region 103A may be a semiconductor material or may be a portion of an isolation region, such as a silicon dioxide region, depending on the overall process and device requirements. It should be appreciated that any isolation regions may also be formed in a later manufacturing stage, if considered appropriate for the further processing of the device 100.

Furthermore, in the manufacturing stage shown, an implantation mask 104, such as a resist mask, is formed above the semiconductor layer 103 and has an appropriate thickness so as to provide the ion blocking capability as is required to avoid penetration of the regions 103B, 103C by any well dopant species that are to be incorporated into the crystalline semiconductor material 101S at a position and with a lateral shape, which are determined by a mask opening 104A of the implantation mask 104.

The semiconductor device 100 as illustrated in FIG. 1a may be formed on the basis of the following processes. The regions 103A, 103B and 103C may be defined in shape and position by forming respective isolation regions, as discussed above, which may be accomplished by using sophisticated lithography techniques, etch processes, deposition processes, anneal techniques and material removal processes. In other cases, the lateral shape and position of the regions 103A, 103B, 103C may be defined on the basis of the implantation mask 104 and on the basis of any subsequently formed implantation masks, when corresponding isolation regions are to be provided in a later manufacturing stage. Next, the implantation mask 104 is provided on the basis of appropriate lithography masks and process techniques in which the opening 104A is provided with a desired lateral size and shape so as to define a region 101A in the crystalline substrate material 101S in which a desired well dopant concentration is to be established in view of forming a diode structure on the basis of the region 101A. To this end, an implantation process 105 is performed by using appropriate energy and dose parameters so as to implant a desired dopant species, such as an N-type dopant species and the like, through the layers 103 and 102 into the region 101A. On the other hand, undue incorporation of the well dopant species in the regions 103B, 103C may be suppressed by the implantation mask 105.

FIG. 1b schematically illustrates the device 100 in a further advanced manufacturing stage. As illustrated, a further implantation mask 106 is formed above the semiconductor layer 103 and comprises appropriate mask openings 106B, 106C, thereby exposing the regions 103B, 103C. The region 103B may correspond to a certain type of transistor to be formed in and above the semiconductor region 103B, while the region 103C corresponds to a semiconductor region in which a diode structure is to be formed. As discussed above, generally it would be preferable to adjust the basic dopant concentration in the regions 103B, 103C independently from each other in order to provide superior flexibility in appropriately adjusting the transistor characteristics and the diode characteristics. On the other hand, this superior degree of flexibility is associated with at least one further lithography step, since corresponding dedicated implantation masks would be required, while also two separate implantation processes have to be performed. Since, in particular, the additional lithography step may contribute to a reduced overall throughput, typically the mask 106 is provided so as to concurrently expose the regions 103B, 103C to an implantation process 107, which is appropriately configured so as to obtain a basic dopant concentration in the regions 103B, 103C that enables the formation of transistors and of a diode structure, however, at the cost of a reduced performance, since the resulting well dopant concentration is a compromise between desired transistor characteristics and a desired ideal diode characteristic. It should be appreciated that the implantation mask 106 may not necessarily have to cover the region 103A if a corresponding incorporation of the well dopant species is considered as acceptable.

FIG. 1c schematically illustrates a cross-sectional view of the semiconductor device 100 in a further advanced manufacturing stage. As shown, a first or substrate diode 130 is formed in the region 101A, while a second diode 150 is formed in the region 103C. Furthermore, a transistor 140 is formed in and above the semiconductor region 103B. Moreover, electrode structures 160A, 160B, 160C may be formed above the regions 103A, 103B, 103C, respectively. For example, the gate electrode structure 160B may represent a part of the transistor 140 and may have any appropriate configuration and length in accordance with the overall transistor characteristics. Furthermore, drain and source regions 141 are formed in the active region 103B and form appropriate PN junctions with the remaining portion or well region 103B so as to obtain transistor characteristics which are thus determined, among other things, by the lateral and vertical profile of drain and source regions 141 and of the basic well dopant concentration of the region 103B, as adjusted on the basis of the implantation process 107 of FIG. 1b. Similarly, a diode structure 150 may comprise doped regions 151A, 151B, for instance in the form of a P-type region and an N-type region, so as to form one PN junction with the well region 103C so as to obtain a diode structure. For example, the regions 103B, 103C may be regions of N-type conductivity so that one of the regions 151A, 151B may be a highly P-doped region, thereby forming a PN junction. In this case, the transistor 140 may represent a P-channel transistor. Since typically the corresponding regions 151A, 151B may be formed together with implantation techniques as are also typically applied in the transistor 140 and in transistors of inverse conductivity type, the resulting characteristics of the diode 150 are also determined by the well dopant concentration in the region 103C and the lateral and vertical dopant profile of the regions 151A, 151B, respectively. In this case, the resulting diode characteristics may represent a compromise with respect to the desired transistor characteristics of, for instance, the device 140.

On the other hand, the substrate diode 130 may have characteristics that are determined by the well dopant concentration in the region 101A, while the dopant profile of highly doped regions 131A, 131B may also be formed together with the drain and source regions of any transistors, such as the transistor 140 and a transistor of inverse conductivity type, so that basically the diode characteristics may also be influenced by the process techniques used for forming the transistors, wherein, however, contrary to the diode 150, the well dopant concentration in the region 101A may be individually adjusted on the basis of the implantation process 105 (FIG. 1a).

Generally, the device 100 may be formed on the basis of any appropriate process strategy, i.e., appropriate materials for the electrode structures 160A, 160B, 160C may be formed, for instance, by oxidation, deposition and the like, and these materials may be patterned on the basis of sophisticated lithography techniques in order to obtain, in particular, the gate electrode structure 160B with the required lateral dimensions, for instance having a gate length of 50 nm and less in sophisticated applications. For example, a gate dielectric material 161 in combination with an electrode material 162, possibly together with appropriate hard mask materials, are patterned, followed by the formation of an appropriate sidewall spacer structure 163, which may also act as an implantation mask when forming the complex lateral and vertical dopant profiles in the transistors of the device 100. At any appropriate stage, an etch process may be performed to expose portions of the region 101A, in which the highly doped regions 131A, 131B are to be provided together with drain and source regions of transistors by using appropriate implantation and masking regimes in order to incorporate a dopant species of one conductivity type in one of the regions 131A, 131B and introducing a dopant species of inverse conductivity type in the other one of the regions 131A, 131B. Furthermore, the regions 151A, 151B may also be formed in the same process sequence, depending on the overall process strategy.

Thereafter, the processing is continued by performing any appropriate anneal processes and, if required, forming metal silicide regions in the highly doped regions of the diodes 130, 150 and in the transistor 140.

Consequently, the process sequence described above provides a very efficient process flow, however, it requires a compromise in performance of the film diode 150 due to the combined formation of a well dopant concentration in the regions 103B, 103C. In sophisticated applications, however, performance of the transistor 140 and/or performance of the diode 150 is to be enhanced which, however, may not be compatible with the conventional process strategy, while separating the implantation processes for forming the well dopant concentration in the regions 103B, 103C may require additional lithography steps.

In view of the situation described above, the present disclosure relates to manufacturing techniques and semiconductor devices in which diode structures in a substrate material and an active semiconductor material may be formed, while avoiding or at least reducing one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which the characteristics of a substrate diode and of a film diode, i.e., of a diode formed in the active semiconductor layer, may be adjusted with superior flexibility without requiring additional lithography steps. To this end, the well dopant species of the substrate diode and of the film diode may be incorporated on the basis of a common implantation mask which thus concurrently defines the shape and lateral position of the well regions in the substrate material and in the active semiconductor material. It has been recognized that the two implantation steps may nevertheless result in substantially decoupled dopant concentration profiles due to the significantly different depth of the implantation processes, thereby enabling a desired individual adjustment of the corresponding well dopant concentrations. On the other hand, the well dopant concentration of transistor elements may be adjusted without requiring taking into consideration the diode characteristics to be implemented into the substrate diode and in the film diode.

One illustrative method disclosed herein relates to forming a semiconductor device. The method comprises forming an implantation mask above a semiconductor layer, wherein the implantation mask has a first mask opening and a second mask opening. The method further comprises performing a first implantation process by using the implantation mask so as to introduce a first well dopant species into a substrate that is formed below the semiconductor layer. The method further comprises performing a second implantation process by using the implantation mask so as to introduce a second well dopant species into the semiconductor layer. Moreover, a first diode structure is formed in the substrate material on the basis of the first well dopant species. Additionally, the method comprises forming a second diode structure in the semiconductor layer on the basis of the second well dopant species.

A further illustrative method disclosed herein comprises forming a first well region in a crystalline substrate material of a semiconductor device by implanting a first well dopant species through at least a buried insulating layer that is formed between the crystalline substrate material and a device layer comprising a plurality of active regions. Furthermore, the method comprises forming a second well region in at least one of a plurality of active regions by implanting a second well dopant species by using an implantation mask. Furthermore, a first diode structure is formed in the first well region and a second diode structure is formed in the second well region.

One illustrative semiconductor device disclosed herein comprises a semiconductor layer formed on a buried insulating layer which is formed on a crystalline semiconductor material of a substrate. The semiconductor device further comprises a first well region formed in the crystalline semiconductor material and a second well region formed in the semiconductor layer. Furthermore, the semiconductor device comprises a third well region formed in the crystalline substrate material below the second well region, wherein the third well region is laterally aligned to the second well region. Additionally, the semiconductor device comprises a first diode structure formed in the first well region and a second diode structure formed in the second well region.

BRIEF DESCRIPTION OF THE DRAWINGS

The disclosure may be understood by reference to the following description taken in conjunction with the accompanying drawings, in which like reference numerals identify like elements, and in which.

Figure 1A:
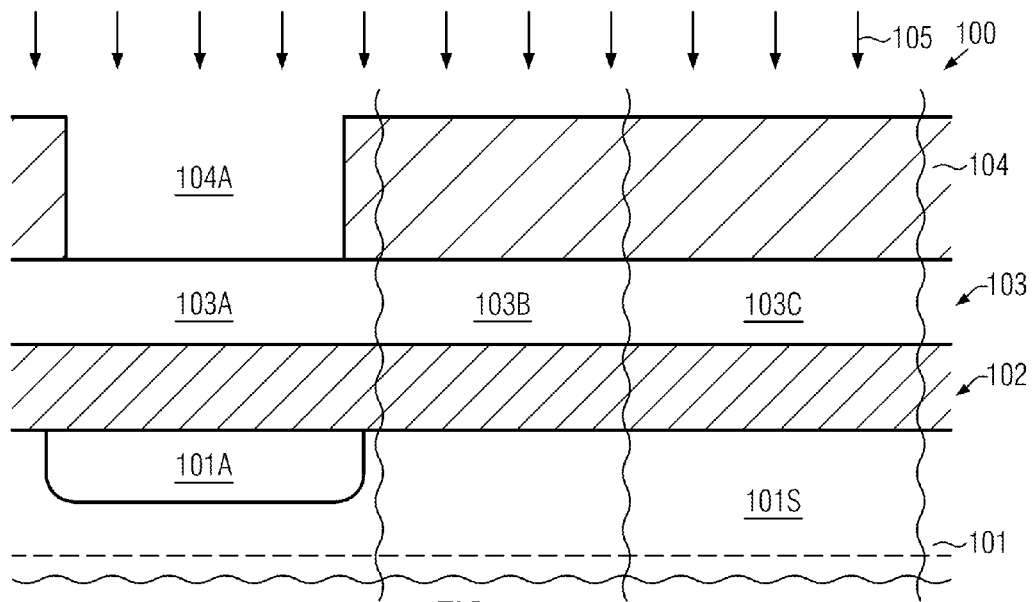
FIGS. 1a-1c schematically illustrate cross-sectional views of a semiconductor device during various manufacturing stages in forming a substrate diode, a film diode and transistors, according to a conventional process strategy.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally contemplates semiconductor devices and manufacturing techniques in which the basic well dopant concentration in substrate diodes and diodes formed in the active semiconductor layer of, for instance, SOI devices may be established independently from the well dopant concentration of transistors, thereby enabling an individual adjustment of the transistor characteristics and the diode characteristics, which may result in superior overall performance of the semiconductor device under consideration. On the other hand, requirement for an additional lithography step may be eliminated by using only one implantation mask for incorporating the required well dopant species for the two different types of diode structures. For example, in some illustrative embodiments, a mask may be provided so as to have appropriate openings which define the lateral shape and position of the well regions of the substrate diode and of the film diode, wherein also a high degree of decoupling of the corresponding well dopant concentrations may be achieved due to the very different implantation parameters, in particular due to the very different implantation energy to be applied during the corresponding implantation steps. In some illustrative embodiments, the implantation processes to be performed on the basis of two different implantation energies and dose values may be performed as an in situ process, i.e., as a process in which both implantation steps may be performed without any additional intermediate substrate transport activity so that basically high throughput may be achieved, although two different implantation steps are performed.

Figure 1B:
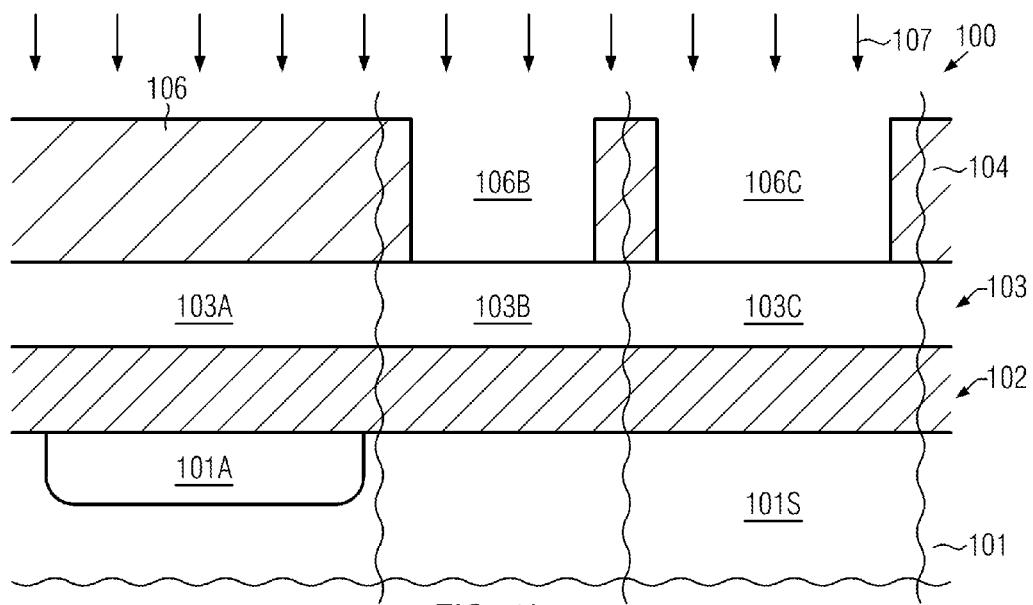
Figure 1C:
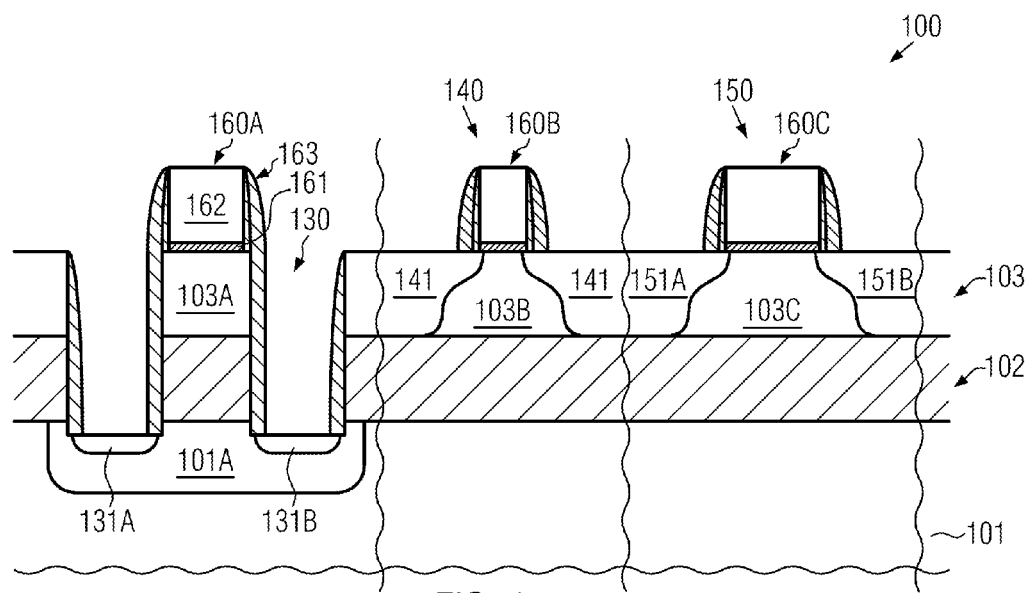
Figure 2A:
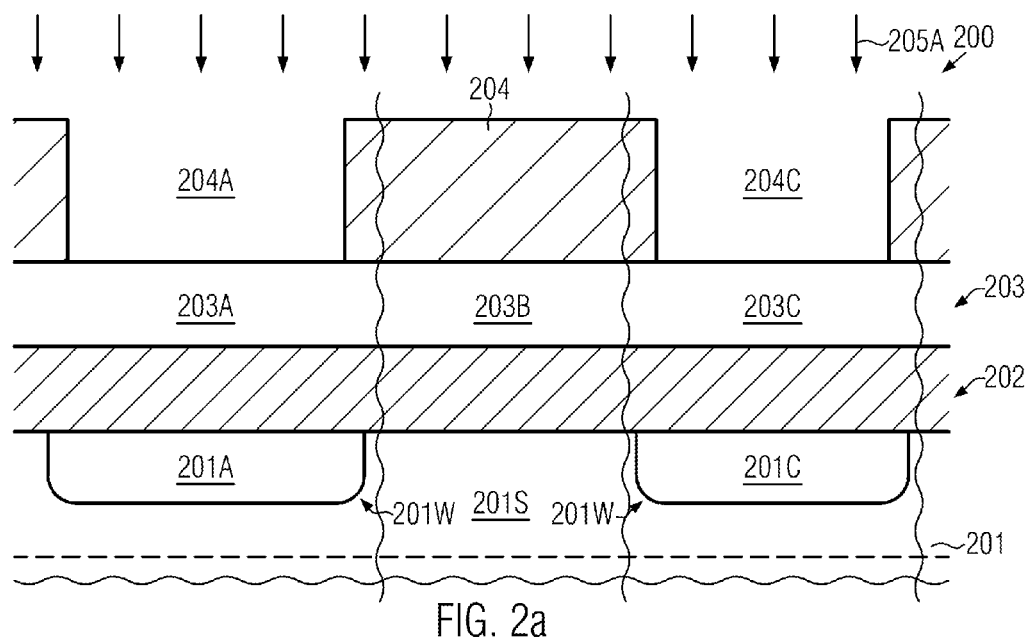
FIGS. 2a-2c schematically illustrate cross-sectional views of a semiconductor device during various manufacturing stages in which a substrate diode, a film diode and transistors may be provided with superior flexibility in separately adjusting the diode characteristics and the transistor characteristics without requiring additional lithography steps, according to illustrative embodiments.
Figure 2B:
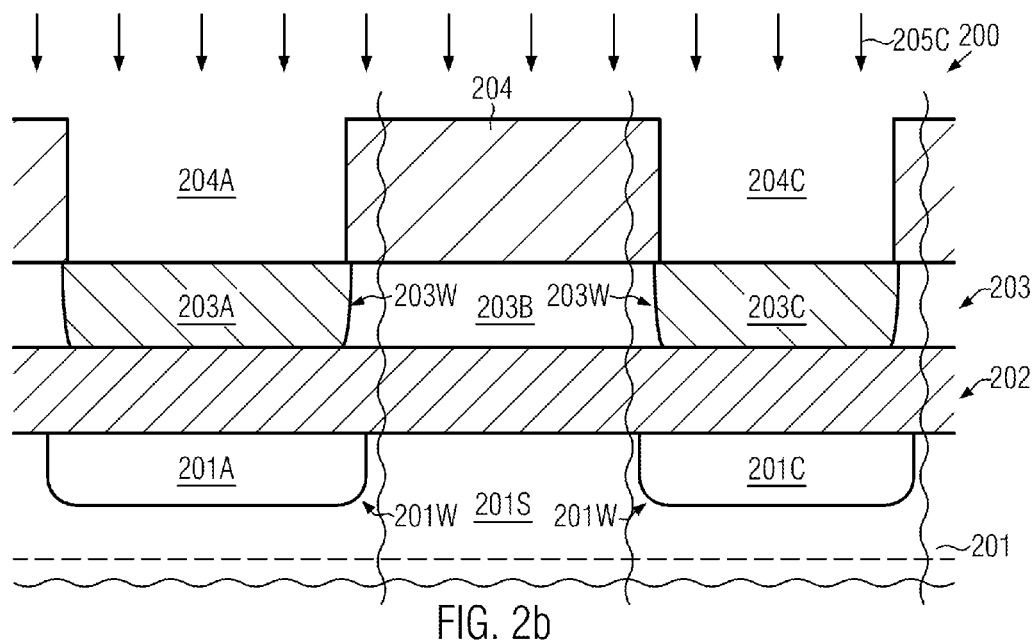
Figure 2C:
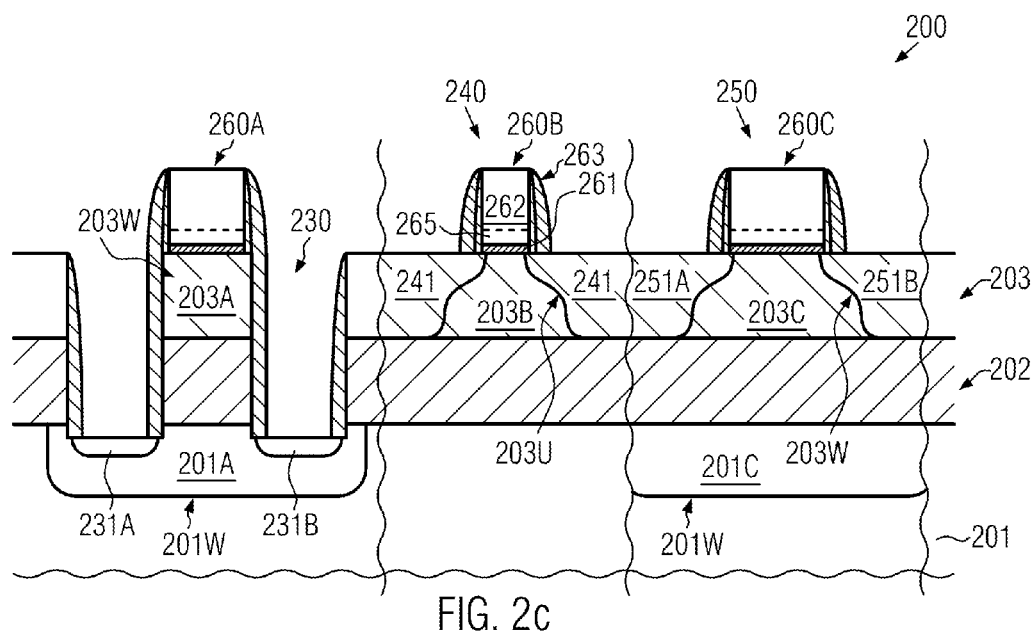

With reference to FIGS. 2a-2c, further illustrative embodiments will now be described in more detail, wherein reference may also be made to FIGS. 1a-1c, if appropriate.

FIG. 2a schematically illustrates a cross-sectional view of a semiconductor device 200 which may comprise a substrate 201 that in turn comprises, at least in an upper portion thereof, a crystalline semiconductor material 201S, such as a silicon material and the like. It should be appreciated that in a lower portion of the substrate 201 (not shown) other materials may be provided, if considered appropriate. Furthermore, in some illustrative embodiments, the device 200 or at least a portion thereof may represent an SOI architecture in which a buried insulating layer 202 is formed on the crystalline substrate material 201S. Furthermore, a semiconductor layer 203, such as a silicon-based material layer, a silicon/germanium layer and the like, may be formed above the substrate 201 and, in the embodiment shown, on the buried insulating material layer 202. As discussed above, the semiconductor layer 203 may also include non-semiconductor areas, such as isolation regions (not shown), which may be formed in the layer 203, which may initially represent a continuous semiconductor material. For example, active regions or semiconductor regions 203B, 203C may be provided with appropriate shape and lateral dimensions. For example, the active region 203B may correspond to one or more transistors to be formed therein and thereabove. On the other hand, the region 203C may correspond to a semiconductor region in which a diode structure is to be formed so as to have appropriately adjusted diode characteristics. Furthermore, a region 203A, which may be a semiconductor region or an isolation region, may be formed in the layer 203 and may basically correspond to the lateral shape and position of a substrate diode to be formed in a semiconductor region 201A positioned in the crystalline semiconductor material 201S. Moreover, in the manufacturing stage shown, an implantation mask 204 may be provided so as to have mask openings 204A, 204C, which thus correspond to the lateral shape and size of the region 201A and also of a region 201C, which, however, may represent a "non-functional" well region in the embodiment shown. At the same time, the openings 204A, 204C define the lateral shape and position of the regions 203A, 203C, possibly in combination with any isolation regions, if already provided in this manufacturing stage.

The semiconductor device 200 as shown in FIG. 2a may be formed on the basis of similar process strategies, as described above, when forming the regions 203A, 203B, 203C in the semiconductor layer 203. Thereafter, the implantation mask 204 may be formed on the basis of an appropriately configured lithography mask and based on an appropriate mask material, such as resist and the like, which may provide sufficient ion blocking capability so as to suppress the incorporation of a well dopant species into the region 203B. Thereafter, an implantation process 205A may be performed so as to incorporate a well dopant species, such as an N-type species or a P-type species, into the material 201S, thereby forming the well regions 201A, 201C, which thus may have substantially the same well dopant profile or concentration as is generally indicated as 201W. It should be appreciated that the dopant profiles 201W are slightly varied due to the nature of the implantation process 205A, and may, however, be considered as substantially identical except for any such minor variations. In other cases, the well dopant concentrations 201W may vary to a certain degree when, for instance, the regions 203A, 203C may be formed as different materials. For example, in some cases, the region 203A may be comprised of an insulating material, such as silicon dioxide, if considered appropriate for the further processing of the device 200. In this case, the ion blocking capability of the regions 203A, 203C may be different so that the resulting profiles in the regions 201A, 201C may also be slightly different, wherein, however, the same conductivity type may be generated in these regions. Consequently, the process parameters of the implantation process 205A may be appropriately selected so as to obtain the desired dopant concentration 201W in the region 201A, wherein generally an appropriate implantation energy is to be selected. On the other hand, the implantation species passing through the region 203C and the layer 202 may thus be substantially stopped within the region 201C, while a significant accumulation in the region 203C may not occur. On the other hand, any implantation-induced damage in the region 203C may be less critical since any such damage may be re-crystallized in a later manufacturing stage.

In some illustrative embodiments, any "deposition" of well dopant species in the region 203C, and also in the region 203A, may be determined in advance, for instance, by performing appropriate measurements so that at least one parameter or metric may be determined, which may indicate a corresponding pre-doping of the region 203C with respect to a further incorporation of the actual dopant species for the region 203C in a further implantation process. In this manner, any effect of the implantation process 205A may be efficiently taken into consideration upon selecting appropriate process parameters for a further implantation process so as to incorporate the well dopant species for the region 203C.

FIG. 2b schematically illustrates the device 200 in a further advanced manufacturing stage. As shown, the further implantation process 205C may be performed on the basis of the implantation mask 204 in order to incorporate a second well dopant species into the region 203C and thus also into the region 203A in order to establish a desired well dopant concentration 203W in the region 203C, in which a corresponding diode structure is to be formed. To this end, the process parameters of the implantation process 205C, in particular the energy thereof, is appropriately selected so as to obtain the desired concentration profile 203W. On the other hand, the layer 202 may efficiently shield the underlying well regions 201A, 201C, thereby not unduly modifying the previously established concentration profile. Consequently, the basic dopant concentration in the regions 203A and 201A may be adjusted in a substantially independent manner on the basis of the same implantation mask 204. Furthermore, as discussed above, any urgent degree of pre-doping and/or post-doping in the regions 201A, 203C may be taken account of by forming appropriate measurements on the basis of any test substrates so that the process parameters of the implantation processes 205A (FIG. 2a) and/or 205C may be appropriately selected so as to achieve, in total, the required well dopant concentrations 203W, 201W.

For example, an influence of the implantation process 205C on the concentration profile in the region 201A may be taken into consideration upon selecting the process parameters of the process 205A, while an influence of the process 205A in the region 203C may be taken into consideration by selecting the process parameters of the process 205C, if the corresponding mutual "interaction" of the implantation steps may be considered as not being negligible. In some illustrative embodiments, the well dopant concentrations 203W, 201W may be established so as to obtain the same conductivity type so that a corresponding counter-doping may be efficiently avoided. In other cases, a corresponding degree of counter-doping may be readily taken into consideration upon appropriately selecting, for instance, the dose of the associated implantation steps. Furthermore, in some illustrative embodiments, the implantation processes 205A (FIG. 2a) and 205C may be applied as an in situ process in which any additional substrate transport activities may be omitted and only the process parameters are appropriately varied. In other cases, the implantation processes may be performed as separate implantation steps, possibly requiring additional substrate transport to different implantation tools and the like.

It should be appreciated that the sequence of the implantation processes 205A (FIG. 2a) and 205C may be reversed in other illustrative embodiments, wherein, in view of overall process parameters, the same criteria may apply as discussed above.

FIG. 2c schematically illustrates the semiconductor device 200 in a further advanced manufacturing stage. As shown, a substrate diode 230 may be formed in the well region 201A, which may have basically the well dopant concentration 201W, as previously established, and which may also comprise highly doped regions 231A, 231B so as to form a PN junction in combination with the well dopant concentration 201W. Similarly, a diode structure 250 may be formed in the semiconductor region 203C, which may have basically the well dopant concentration 203W, as previously established, wherein highly doped regions 251A, 251B may provide one PN junction, the characteristics of which may thus be determined by the well dopant concentration 203W and the vertical and lateral dopant profile of the regions 251A, 251B.

Furthermore, a transistor 240 may be formed in and above the active region 203B and may comprise highly doped drain and source regions 241, while a well dopant concentration 203U may be established in the region 203B so as to comply with desired transistor characteristics of the device 240. It should be appreciated that, in some illustrative embodiments, the well dopant concentration 203U of any transistor of the device 200 may be different with respect to the well dopant concentration 203W of the diode 250, since any well dopant concentration 203U may be established independently from the concentration profile 203W, as is also discussed above. The transistor 240 may also comprise a gate electrode structure 260B which may have any appropriate configuration. For example, the gate dielectric material 261, such as a silicon dioxide-based gate dielectric material, in combination with an electrode material 262 may be provided. In other sophisticated applications, the gate dielectric material 261 may comprise a high-k dielectric material, which is to be understood as a dielectric material having a dielectric constant of 10.0 and higher. For example, hafnium oxide, zirconium oxide, silicon-containing hafnium oxide and the like may represent appropriate dielectric materials with a high-k value. In this case, additionally a metal-containing electrode material 265 may be formed above the gate dielectric material 261 so as to further enhance overall performance of the gate electrode structure 260B. It should be appreciated that, in other illustrative embodiments, any such sophisticated material systems, i.e., a high-k dielectric material and/or a metal-containing electrode material, may be provided in a later manufacturing stage, if desired. Moreover, the gate electrode structure 260B may have any appropriate gate length, which may be 50 nm and less in sophisticated applications.

Moreover, an electrode structure 260A may be formed of the diode 230 and thus above the semiconductor region 203A, i.e., a remaining portion thereof, which may still have incorporated therein the dopant concentration 203W, which may thus be very similar to the concentration 203W of the diode 250. In particular, when the region 203A is a semiconductor region, the corresponding well dopant concentrations may be highly similar to each other and may be considered as identical except for any minor variations. Basically, the electrode structure 260A may have the same configuration in terms of materials used, except for the lateral dimensions thereof, and may thus be considered as a dummy electrode structure.

Similarly, in some cases, an electrode structure 260C may also be formed above the region 203C, wherein also basically the same materials may be used as in the gate electrode structure 260B.

The semiconductor device 200 as illustrated in FIG. 2c may be formed on the basis of any appropriate process strategy, as is, for instance, also discussed above with reference to the semiconductor device 100. For example, the highly doped regions 231A, 231B, the drain and source regions 241 and the highly doped regions 251A, 251B may be formed by appropriately forming a spacer structure 263 and applying an appropriate masking regime. For example, one of the highly doped regions 231A, 231B and one of the highly doped regions 251A, 251B may be formed together with deep drain and source regions (not shown) of the transistor 240. Similarly, the other one of the highly doped regions 231A, 231B and 251A, 251B may be formed together with deep drain and source areas of a transistor of different conductivity type. After any implantation processes, an appropriate anneal process or process sequence may be applied so as to activate the dopant species and re-crystallize implantation-induced damage. It should be appreciated that appropriate anneal processes may also be applied prior to forming any drain and source regions in order to activate the dopants, the well regions 201A and 203C, if considered appropriate.

Consequently, in this manufacturing stage, the diode 250 may have appropriate diode characteristics determined by the well dopant concentration 203W, while the well region 201C formed in the substrate 201 may represent a dummy well region without an electrical function. On the other hand, the diode 230 may have appropriate diode characteristics substantially determined by the well dopant concentration 201W in the well region 201A, wherein, as discussed above, the concentrations 201W of the region 201A and of the region 201C may be substantially identical due to the previous common process sequence for incorporating the well dopant species when a configuration of the regions 203A, 203C is the same. Similarly, the remaining portion of the region 203A and the region 203C may have substantially the same well dopant concentration 203W, if both regions are comprised of the same base material. Thus, the concentration 203W may be selected so as to obtain the desired characteristics for the device 250. On the other hand, the well dopant concentrations 203U of any transistors, such as the transistor 240, may be selected independently from the diode structures 230, 250.

As a result, the present disclosure provides semiconductor devices and manufacturing techniques in which the diode characteristics of a substrate diode and a film diode may be adjusted independently from the well dopant concentrations of any transistor, without requiring any additional lithography steps. To this end, the well region in the substrate and the well region in the active semiconductor layer may be formed on the basis of the same implantation mask. Consequently, superior performance in SOI devices may be achieved while not negatively affecting the overall process throughput.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device comprising:
  a semiconductor layer formed on a buried insulating layer, said buried insulating layer being formed on a crystalline semiconductor material of a substrate;
  a first well region formed in said crystalline semiconductor material;
  a second well region formed in said semiconductor layer;
  a third well region formed in said crystalline substrate material below said second well region, said third well region being laterally aligned to said second well region, wherein said third well region is a dummy well region that serves no electrical function;
  a first diode structure formed in said first well region; and
  a second diode structure formed in said second well region.

2. The semiconductor device of claim 1, wherein said first and third well regions have substantially the same dopant concentration and dopant concentration profile.

3. The semiconductor device of claim 1, further comprising an electrode structure formed above said first well region, wherein a dopant concentration of a region below said electrode structure substantially corresponds to a dopant concentration of said second well region.

4. The semiconductor device of claim 2, further comprising an electrode structure formed above said first well region, wherein a dopant concentration of a region below said electrode structure substantially corresponds to a dopant concentration of said second well region.

5. A semiconductor device comprising:
  a semiconductor layer formed on a buried insulating layer, said buried insulating layer being formed on a crystalline semiconductor material of a substrate;
  a first well region formed in said crystalline semiconductor material;
  a second well region formed in said semiconductor layer;

a third well region formed in said crystalline substrate material below said second well region, said third well region being laterally aligned to said second well region, wherein said first and third well regions have substantially the same dopant concentration and dopant concentration profile and wherein said third well region is a dummy well region that serves no electrical function;

a first diode structure formed in said first well region; and a second diode structure formed in said second well region.

6. The semiconductor device of claim 5, further comprising an electrode structure formed above said first well region, wherein a dopant concentration of a region below said electrode structure substantially corresponds to a dopant concentration of said second well region.

7. A semiconductor device comprising:

a semiconductor layer formed on a buried insulating layer, said buried insulating layer being formed on a crystalline semiconductor material of a substrate;

a first well region formed in said crystalline semiconductor material;

a second well region formed in said semiconductor layer;

a third well region formed in said crystalline substrate material below said second well region, said third well region being laterally aligned to said second well region, wherein said third well region is a dummy well region that serves no electrical function;

a first diode structure formed in said first well region;

a second diode structure formed in said second well region; and an electrode structure formed above said first well region, wherein a dopant concentration of a region below said electrode structure substantially corresponds to a dopant concentration of said second well region.

* * * * *